(12) United States Patent
O'Sullivan et al.

(10) Patent No.: US 7,074,049 B2
(45) Date of Patent: Jul. 11, 2006

(54) KELVIN CONTACT MODULE FOR A MICROCIRCUIT TEST SYSTEM

(75) Inventors: John W. O'Sullivan, Hanover, MN (US); John E. Nelson, Brooklyn Park, MN (US)

(73) Assignee: JohnsTech International Corporation, Minneapolis, MN (US)

( * ) Notice: Subject to any disclaimer, the term of this patent is extended or adjusted under 35 U.S.C. 154(b) by 0 days.

(21) Appl. No.: 11/085,782

(22) Filed: Mar. 21, 2005

(65) Prior Publication Data

US 2005/0227512 A1 Oct. 13, 2005

Related U.S. Application Data

(60) Provisional application No. 60/555,383, filed on Mar. 22, 2004.

(51) Int. Cl.
*H01R 12/00* (2006.01)
(52) U.S. Cl. .......................... 439/72; 439/886
(58) Field of Classification Search ............ 439/70–72, 439/886
See application file for complete search history.

(56) References Cited

U.S. PATENT DOCUMENTS

| 4,577,922 A | * | 3/1986 | Stipanuk et al. ............ 439/629 |
| 4,921,430 A | * | 5/1990 | Matsuoka ..................... 439/72 |
| 5,096,426 A | * | 3/1992 | Simpson et al. .............. 439/66 |
| 5,967,848 A | * | 10/1999 | Johnson et al. ............. 439/620 |

* cited by examiner

*Primary Examiner*—Tho D. Ta
(74) *Attorney, Agent, or Firm*—Nawrocki, Rooney & Sivertson, P.A.

(57) ABSTRACT

A test assembly for testing electrical performance of microcircuits contained in leadless packages has Kelvin contacts. Slider contacts in a plurality of contact assemblies slide compliantly to accommodate lack of coplanarity in terminals on the package. A resilient elastomeric block may be inserted through interior spaces of the contact assembly and in interfering relation with features of a housing that supports and aligns the contact assemblies, to apply force to the slider contacts to force them against the microcircuit terminals.

3 Claims, 7 Drawing Sheets

KELVIN CONTACT MODULE FOR A MICROCIRCUIT TEST SYSTEM

CROSS REFERENCE TO RELATED APPLICATIONS

This is a regular application filed under 35 U.S.C. § 111(a) claiming priority, under 35 U.S.C. § 119 (e) (1), of provisional application Ser. No. 60/555,383 previously filed Mar. 22, 2004 under 35 U.S.C. § 111 (b).

BACKGROUND OF THE INVENTION

Testing microcircuits before soldering them onto circuit boards is good manufacturing practice. Defective microcircuits are difficult or impossible to remove from a circuit board, so installing a defective microcircuit typically requires scrapping the entire circuit board. In general, testing of an individual microcircuit involves temporarily connecting test contacts to the microcircuit terminals, and then using special test circuitry connected to the test contacts to operate the microcircuit to test the microcircuit functions.

Microcircuits are provided in a number of different package types. The means for connecting test contacts to a particular type of microcircuit depends on the type of package enclosing the microcircuit and the type of contacts carried by the package. Of course, making good contact between every one of the test contacts and the associated microcircuit terminal is very important, since a bad test connection to even one microcircuit terminal will indicate the microcircuit as defective even though the microcircuit may in fact be fully functional.

The type of package of interest for this invention is the so-called leadless package, where small connector pads along the edges of one face form solder terminals by which the package is electrically and mechanically connected to the circuit board. Internal wiring connects the internal microcircuit to the solder terminals. Hereafter the term "package" will refer to so-called leadless packages unless otherwise stated or the context clearly indicates otherwise. Further, the microcircuit under test is conventionally referred to as the "DUT", that is, device under test.

Such package solder terminals may be 2–mm. wide along the edge of the package surface and perhaps 5 mm. long. The spacing between terminals may be 1–2 mm.

Due to unavoidable variations in the manufacturing process, the connector pad surfaces in leadless packages are not completely coplanar. This does not affect the soldering process because the solder can fill in between the circuit board contacts and the package terminals.

But when temporarily connecting test contacts to package terminals, the lack of co-planarity may cause poor or even no contact between the test contacts and the package terminals. For this reason, test contacts are usually designed to be compliant, that is shift or move under load so that each test contact makes solid mechanical and electrical contact with the package terminal.

Not only does the lack of co-planarity cause problems when testing microcircuits in leadless packages, but other problems may as well cause poor electrical connections between the test contacts and the package terminals. For example, oxides may interfere with the electrical connections, particularly because the current involved are often in the μa. or ma. range. In other cases, dirt between the test contacts and the package terminals can cause poor or no electrical connection.

When these conditions arise, packages that are in fact totally functional may be found to be defective. They will then be discarded unnecessarily, which obviously adds unnecessary cost to the manufacturing process. Accordingly, it is usually cost-effective to take substantial precautions to assure good electrical connections between the test contacts and the package terminals when testing microcircuit packages.

One approach to detect poor electrical connections between the test contacts and the package terminals places two test contacts on each package terminal. These types of contacts to microcircuit terminals have been given the term of art of "Kelvin contacts". U.S. Pat. Nos. 6,293,814; 5,565,787; and 6,069,480 are three patents that show various types of Kelvin contact testing systems.

With two test contacts on each package terminal, the testing system can easily check for good electrical connection between the test contacts and the DUT package terminals. If the sensed connection resistance is too large, this may indicate a problem with the test system itself rather than with the DUTs. At any rate, false failure indications are often reduced significantly using the Kelvin testing system.

A further issue is with the design of the compliant test contacts. U.S. Pat. No. 5,609,489 shows a type of test contact having a conducting, arctuate slider with a test contact end. The slider is shaped to slide within a conforming arctuate channel in a conducting frame element. The test contact end projects from the channel. A resilient elastomeric spring urges the slider from the channel. A number of these slider/frame units are arranged side by side on a circuit board forming a part of the test system, and in alignment with the spacing of the individual terminals of the DUT.

In use, the DUTs terminals are pressed against the aligned test contact ends. The sliders adjust the amount by which they project from the channels and above the test system circuit board, to make good mechanical and electrical contact with the DUT terminals.

SUMMARY OF THE INVENTION

A test assembly for testing electrical performance of microcircuits contained in leadless packages has Kelvin contacts. Slider contacts in a plurality of contact assemblies slide compliantly to accommodate lack of coplanarity in terminals on the package. A resilient elastomeric block may be inserted through interior spaces of the contact assembly and in interfering relation with features of a housing that supports and aligns the contact assemblies, to apply force to the slider contacts to force them against the microcircuit terminals.

DETAILED DESCRIPTION OF THE INVENTION

Figure 1:
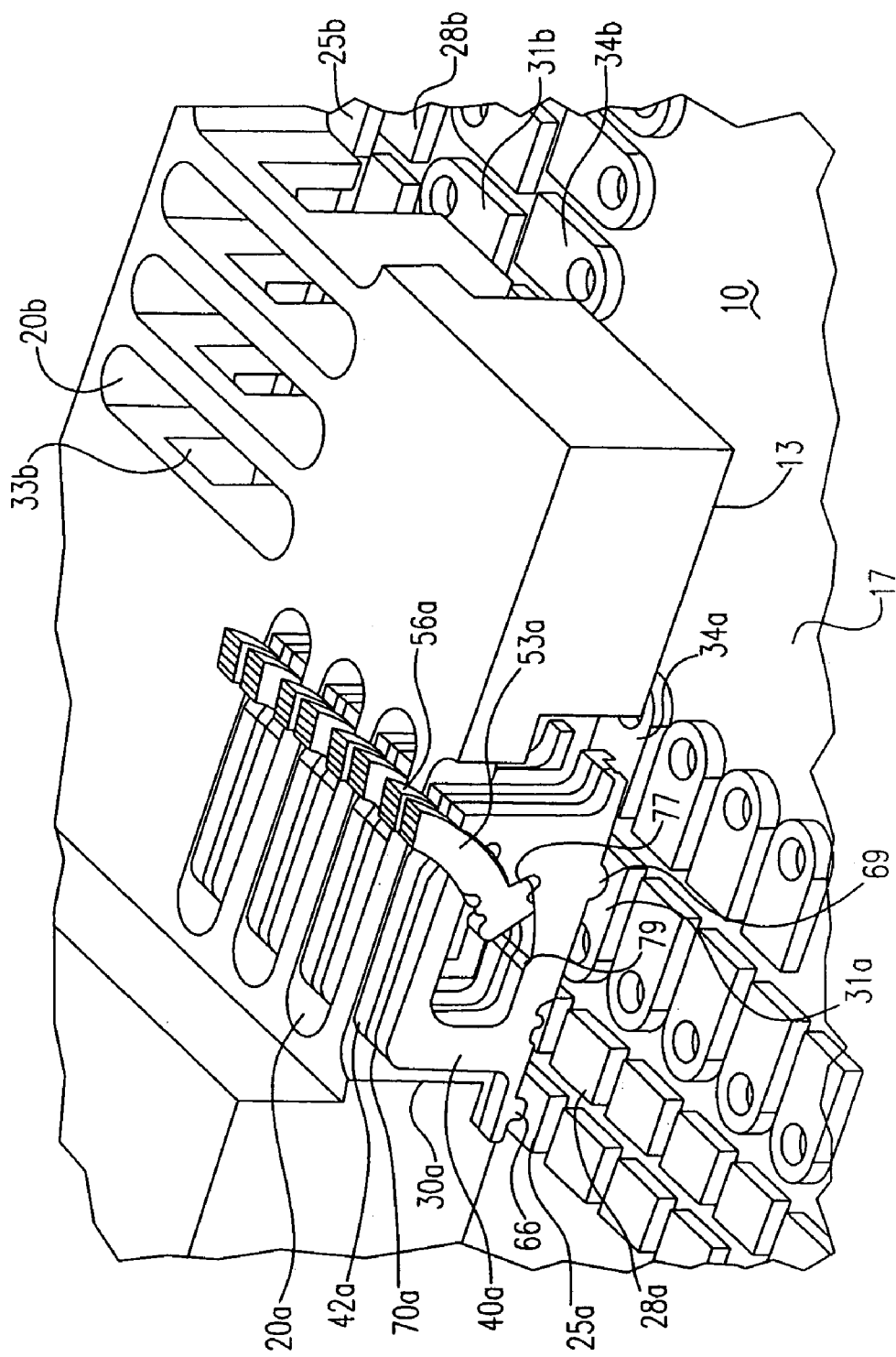
FIG. 1 is a perspective view of a test system showing a plurality of contact assemblies assembled in a housing attached to a circuit board with which the contact assemblies make electrical contact.
Figure 2:
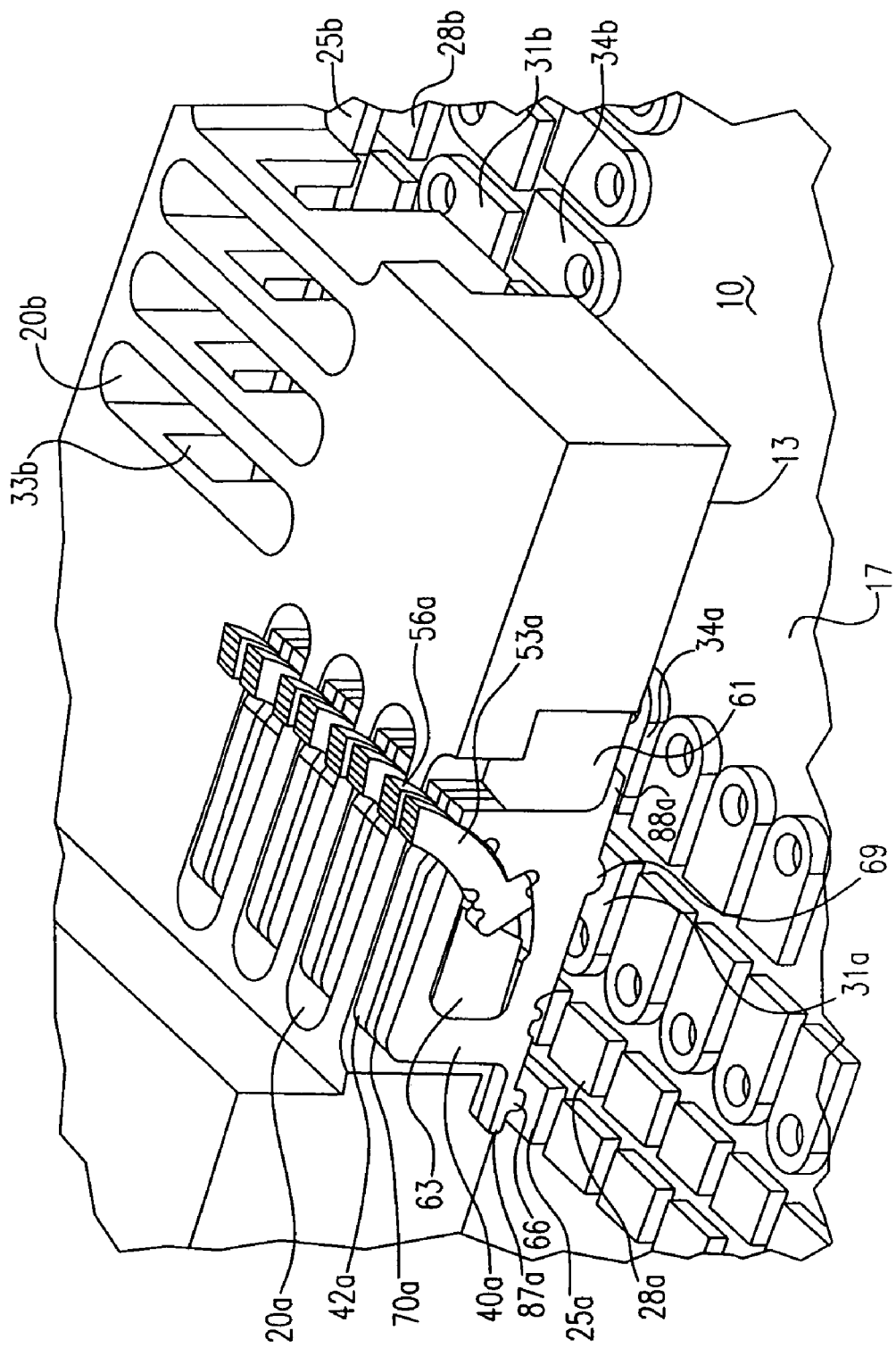
FIG. 2 is a perspective view similar to that of FIG. 1 of a test system, showing elastomeric blocks installed to retain and activate the plurality of contact assemblies assembled in the housing.
Figure 3:
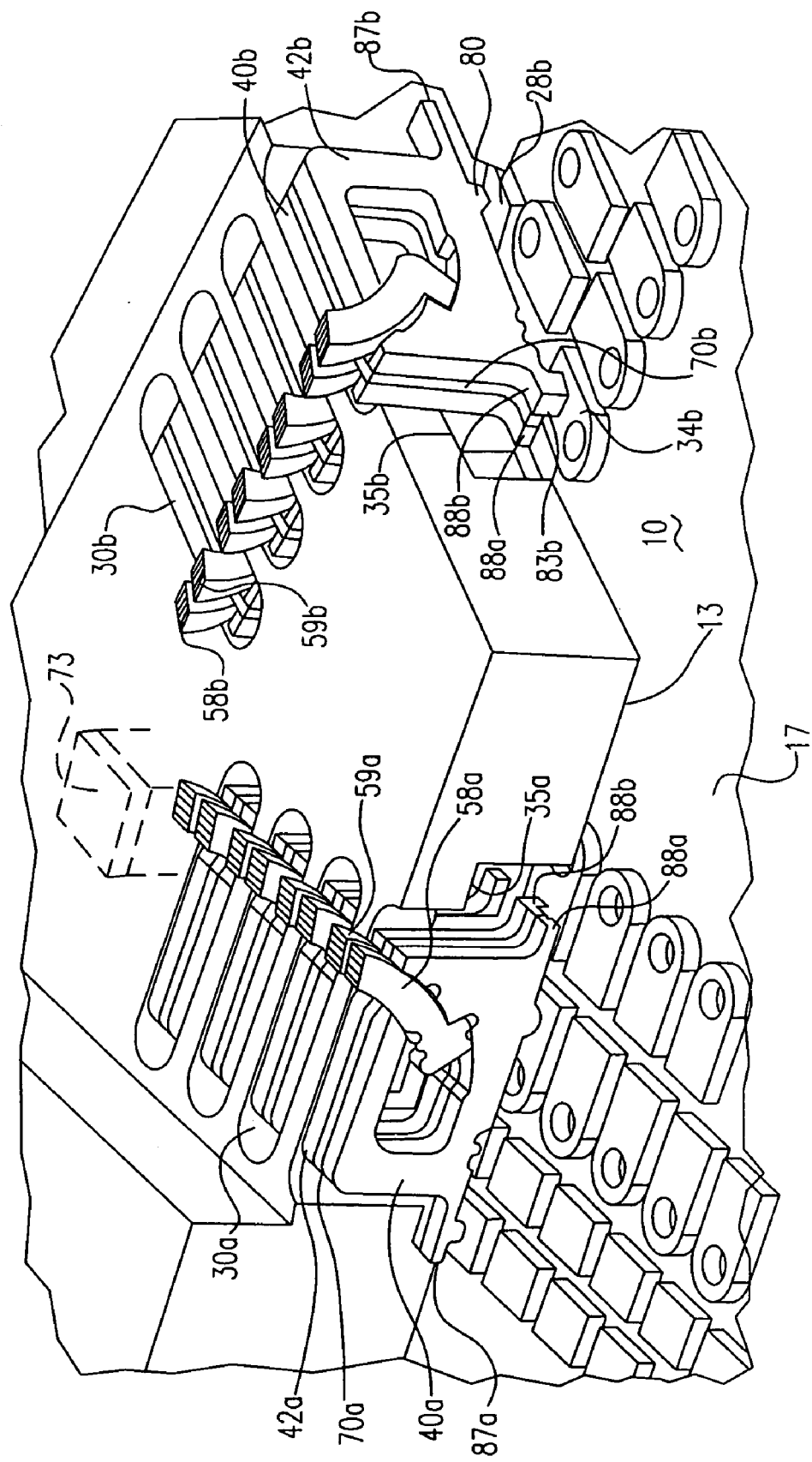
FIG. 3 is a further perspective view similar to that of FIGS. 1 and 2, of a test system, showing two sets of installed contact assemblies assembled in the housing.

Turning first to FIGS. 1–3, a portion of a test system 10 or 10' includes a housing 13 made of an electrically insulating material. Housing 13 has a number of spaced apart frame slots as at 20a in a first row and a second row as at 20b, etc. The center-to-center spacing between individual slots 20a, etc. in the first row and slots 20b, etc. in the second row, and the number of slots 20a, 20b, etc. must match the center-to-center spacing and the number of the terminals as at 73 (FIG. 1) on the DUT.

Housing 13 is mounted on a test circuit board 17. Housing 13 has a series of openings as at 33b between each pair of adjacent slots 20b, and a pair of slots (not visible) also between each pair of adjacent slots 20a. Openings 33b are in substantial transverse alignment with each other, as are also those between pairs of adjacent slots 20a. The inboard ends of slots 20a, etc. include a downwardly facing ledge 35a. The inboard ends of slots 20b, etc. include a downwardly facing ledge 35b.

A first series of electrical contact pads on board 17 are arranged in first and second rows of contact pads 31a, etc. and 34a etc. respectively, below and in alignment with the slots 20a, etc. A second series of electrical contact pads on board 17 are arranged in first and second rows of contact pads 31b, etc. and 34b, etc. respectively, below and in alignment with the slots 20b, etc. Contact pads 31a, 31b, 34a, 34b, etc. are to be connected to test hardware, not shown, for testing the DUT.

The contact pads 31a, etc. in the first row are offset with respect to the contact pads 34a, etc. in the second row. The first and second rows of contact pads 31b, etc. and 34b, etc. are similarly offset with respect to each other. The reasons for this offset arrangement of the first rows of contact pads 31a, etc. and 31b, etc. with respect to the second rows of contacts 34a, etc. and 34b, etc. respectively will be explained below.

A first series of support pads on board 17 are arranged in a first row of pads 25a, etc. in alignment with the slots 20a, etc. and with contacts 31a, etc. The first series of support pads on board 17 further includes a second row of pads 28a, etc. in alignment with the slots 20a, etc. and with contacts 34a, etc.

A second series of support pads on board 17 is arranged in a first row of pads 25b, etc. in alignment with the slots 20b, etc. and with contacts 31b, etc. The second series of support pads on board 17 further includes a second row of pads 28b, etc. in alignment with the slots 20a, etc. and with contacts 34b, etc.

Each slot 20a, etc. holds a contact assembly 30a, etc. as shown in FIG. 3. Each slot 20b, etc. holds a contact assembly 30b, etc. as further shown in FIG. 3. Contact assemblies 30a and 30b will typically be identical to each other.

Figure 4:
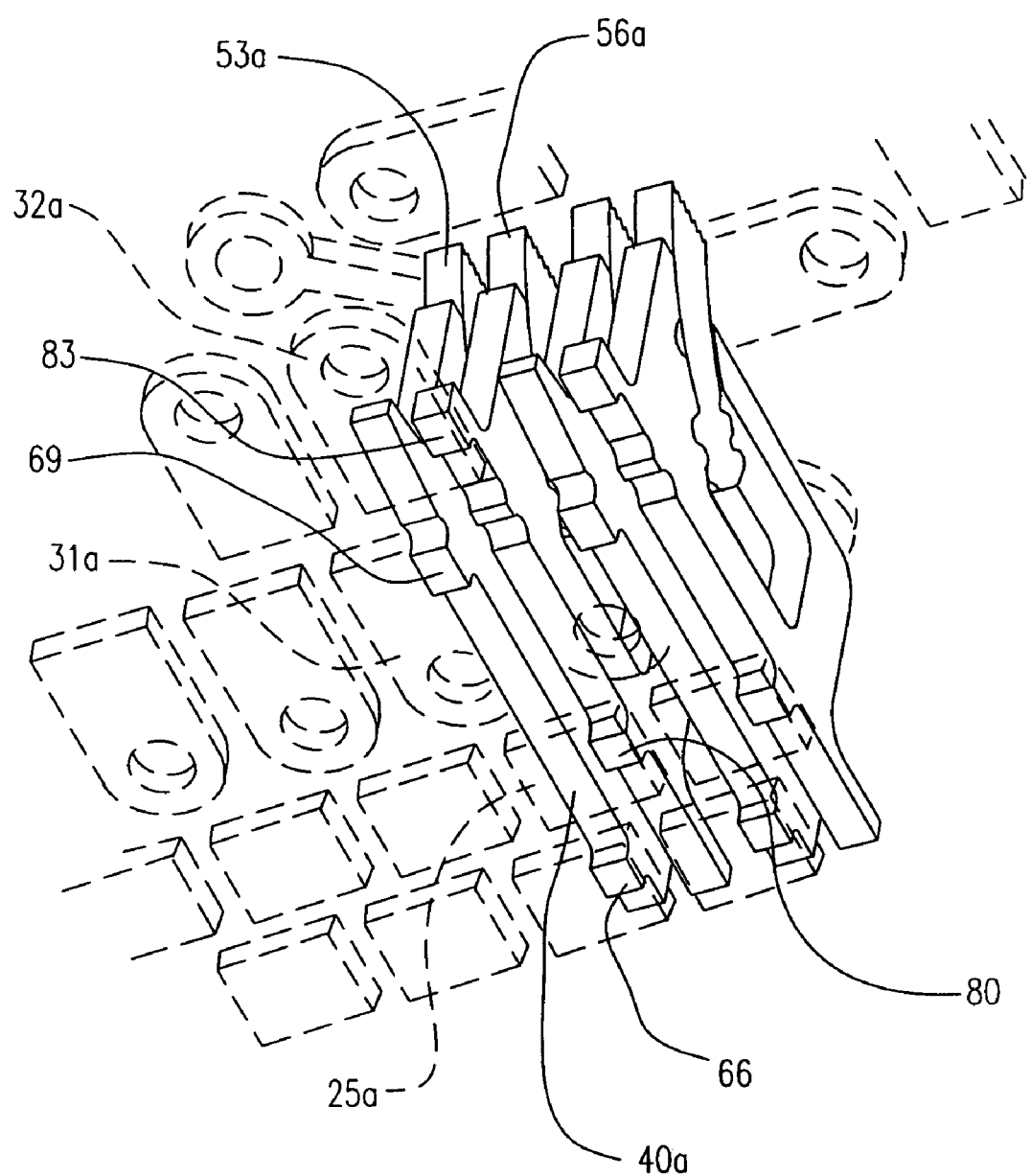
FIG. 4 is a bottom perspective view showing how contact feet carried on the contact assemblies make electrical and mechanical contact with contact pads on the circuit board.
Figure 5:
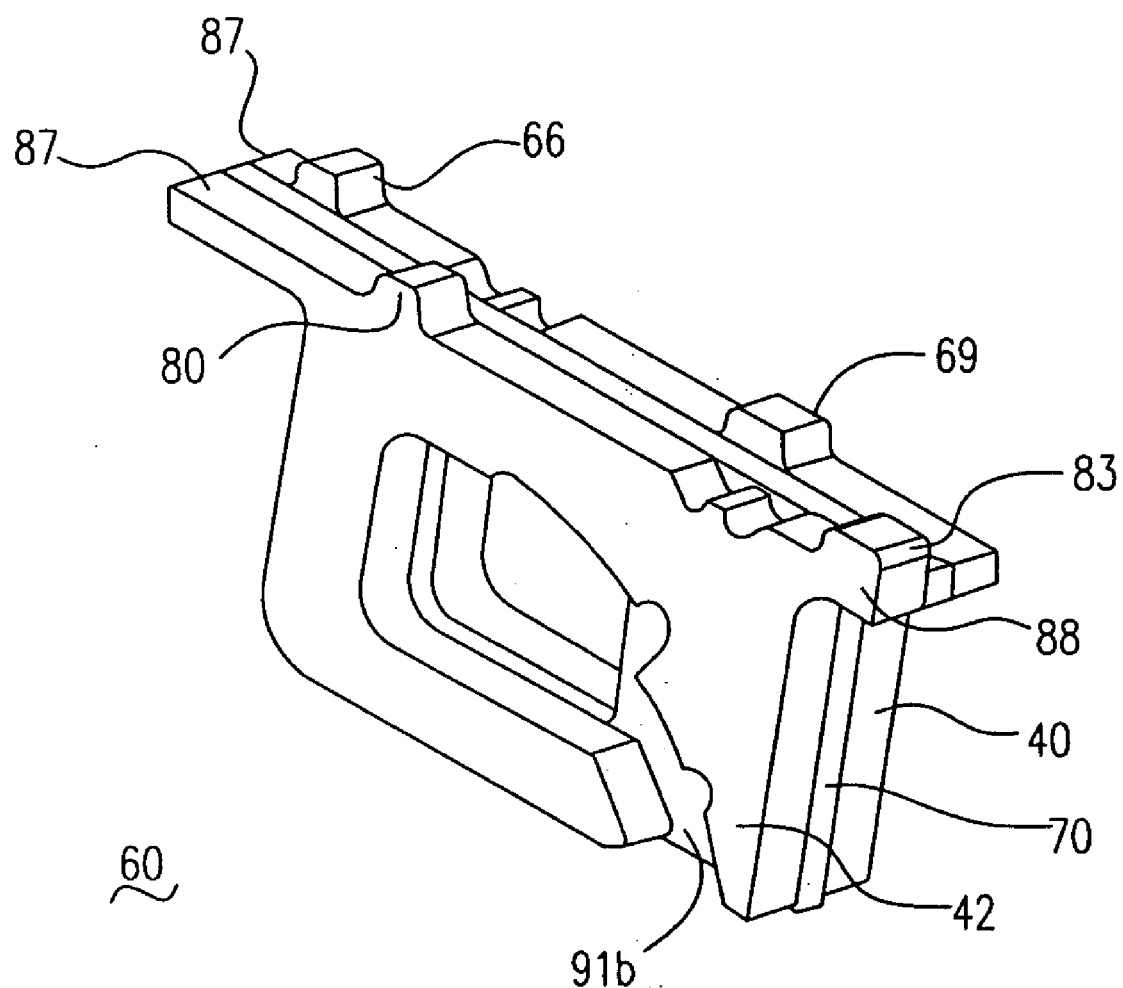
FIG. 5 is a perspective view of the two conducting laminations and the insulating lamination, all properly juxtaposed to form the frame of a contact assembly.
Figure 6A:
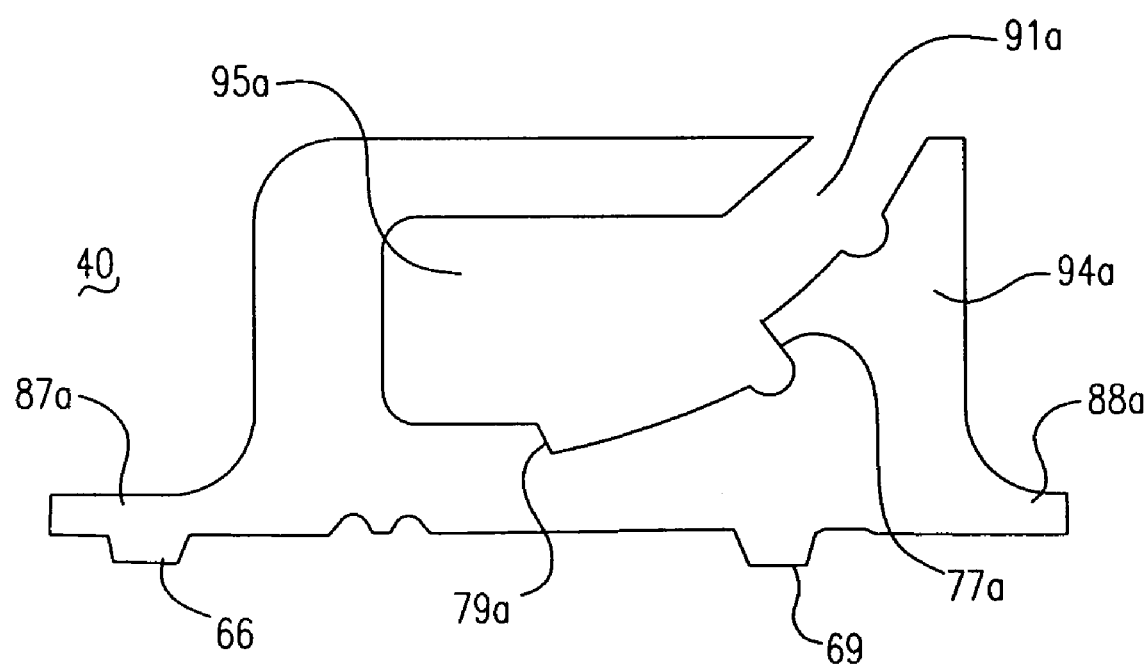
FIGS. 6A and 6B are elevation views of the two conducting laminations that form a contact assembly.
Figure 6B:
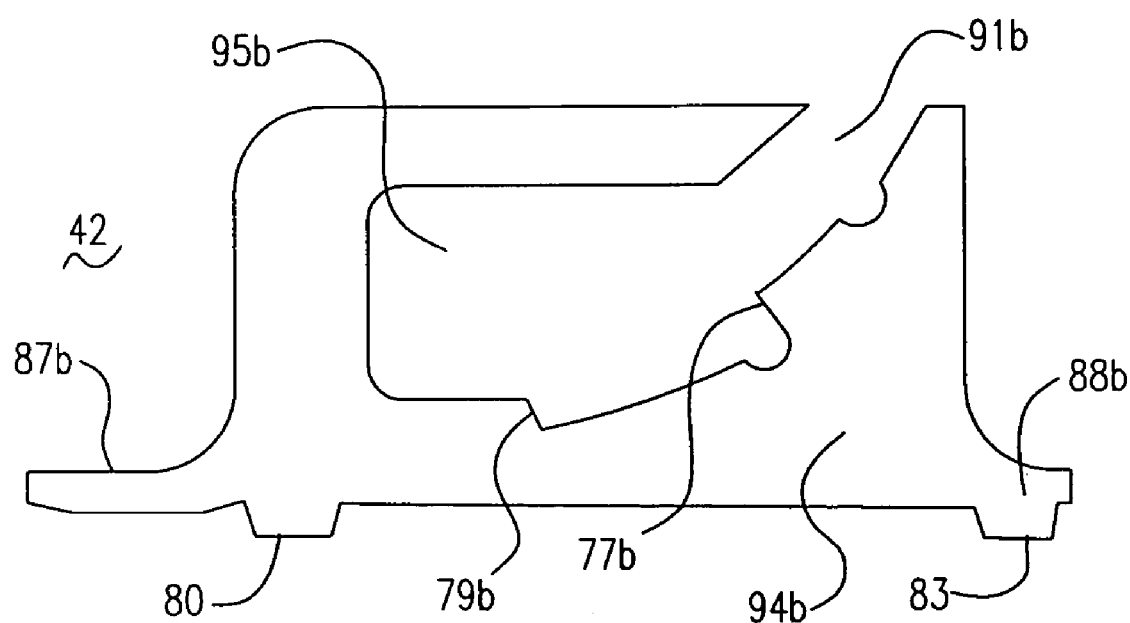

Each contact assembly 30a and 30b comprises a frame assembly 60 as shown in FIGS. 5, 6A, and 6B, and first and second slider contacts 53a and 56a as shown in FIGS. 1–4. Each contact assembly 30a and 30b also includes a pair of slider contacts 53a and 56a as shown for contact assembly 30a in FIGS. 1 and 2.

Each frame assembly 60 comprises an electrically conductive sense lamination 42, a conductive force lamination 40, and an insulating lamination 70 between the laminations 40 and 42. The insulation lamination 70 serves to electrically insulate sense lamination 42 from force lamination 40. Although the three laminations 40, 42, and 70 appear to be unitary in FIG. 5, in actuality each lamination can slide freely with respect to the others.

FIG. 6A shows force lamination 40 in side elevation. Lamination 40 includes a wall 94a defining an opening 95a and a slot 91a. Opening 95a has a first stop surface 77a and a second stop surface 79a. At a left or rear side, an external tail 87a carries a downwardly projecting support foot 66 near to the rear or left end of tail 87a. Wall 94a also carries a downwardly projecting contact foot 69 spaced from the front or right end of wall 94a and an external nose 88a projecting from wall 94a.

As shown in FIGS. 1 and 4, when the test system 10 is completely assembled, contact foot 69 is to rest on and make electrical connection with a contact pad 31a or 34b on the surface of circuit board 17. Support foot 66 is to rest on a support pad 25a or 25b.

FIG. 6B shows sense lamination 42 in side elevation. Lamination 42 includes a wall 94b defining an opening 95b and a slot 91b. Opening 95b has a first stop surface 77b and a second stop surface 79b. Wall 94b at a left or rear side carries an external tail 87b. Wall 94b also carries a downwardly projecting support foot 80 spaced from tail 87b. Wall 94b carries on an external projecting nose 88b on the lower section thereof a downwardly projecting contact foot 83 near to the lower and front or right end of wall 94b.

As shown in FIGS. 3 and 4, when the test system 10 is completely assembled, contact foot 83 is to rest on and make electrical connection with a contact pad 34a or 34b on the surface of circuit board 17. Support foot 80 is to rest on a support pad 25a or 25b.

Importantly, each contact foot 83 is staggered with respect to the adjacent contact foot 69. This staggered relationship allows each contact foot 69 to rest on only a contact pad 31a or 31b and each contact foot 83 to rest on only a contact pad 34a or 34b.

Each of the laminations 40 and 42 respectively has within the openings 95a and 95b, nearly identical stop edges 79a and 79b, and nearly identical stop edges 77a and 77b. Stop edges 79a, 79b, 77a, and 77b interact with features on slider contacts 53a and 56a to restrict movement of slider contacts 53a and 56a within slots 91a and 91b respectively.

FIG. 1 shows this interaction. Slider 53a is shown mounted within slot 91a with an interior end within opening 95a. Features on the interior end of slider 53a interact with stop edge 77a to retain slider 53a within slot 91a and opening 95a. At the same time, contact ends 58a and 59a project upwardly from slots 91a and 91b as shown in FIG. 3. Each pair of projecting contact ends 58a and 59a presses against a single contact 73 of the DUT. Of course, each lamination 40 and 42 in a contact assembly 30a or 30b must be electrically isolated from each other except for the contact on the DUT terminal 73 that each of the sliders 53a and 56a make.

FIGS. 1–3 show individual contact assemblies 30a, 30b, etc. within slots 20, 20b, etc. The dimensions of contact assemblies 30a, 30b, etc. permit slots 20a, 20b, etc. to closely house contact assemblies 30a, 30b, etc. and at the same time allow slight shifting of contact assemblies 30a, 30b, etc. within slots 20a, 20b, etc. in a plane perpendicular to circuit board 17.

Slots 20*a*, 20*b*, etc. are loaded with contact assemblies 30*a*, 30*b*, etc. before housing 13 is mounted on circuit board 17. Housing 13 mounts on circuit board 17 so that each contact foot 69 rests on a contact pad 31*a* or 31*b*, and so that each contact foot 83 rests on a contact pad 31*b* or 34*b*.

FIG. 2 shows a first elastomeric block 63 that passes through all of the openings 95*a* and 95*b* and openings 33*b*. The sizes and shapes of the openings 95*a* and 95*b* and openings 33*b* and of the elastomeric block 63 are such that installation of housing 17 on circuit board 13 compresses block 63, thereby urging contact feet 69 and 83 and support feet 66 and 80 against the various pads 25*a*, 28*a*, 31*a*, etc. carried on circuit board 13.

Further, block 63 presses against the interior end of each slider 53*a*, 56*a*, etc., to thereby urge sliders 53*a*, 56*a*, etc. against an adjacent DUT terminal 73. The elastomeric block 63 provides consistent pressure against each slider 53*a*, 56*a*, etc. to urge the ends 58*a* and 59*a* against the DUT terminals 73.

A second elastomeric block 61 is interposed between the individual noses 88*a* and 88*b* carried by the individual contact assemblies 30*a*, 30*b*, etc., and the adjacent downwardly facing ledges 35*a* and 35*b*. Only one elastomeric block 61 is shown in FIG. 3, interposed between ledge 35*a* and noses 88*a* and 88*b* on each of the contact assemblies 30*a*, 30*b*, etc. A similar block will of course be interposed between ledge 35*b* and the adjacent noses 88*a* and 88*b*.

As with block 63, block 61 is distorted and compressed when housing 13 is attached to circuit board 17. The resilience of blocks 61 and 63 force contact feet 69 and 83 against the contact pads 31*a*, 31*b*, 34*a*, and 34*b* etc. This force accommodates variations in contact assemblies 30*a*, 30*b*, etc. to assure consistent contact force between contact pads 31*a*, 31*b*, 34*a*, and 34*b* etc. and contact feet 69 and 83.

During a testing episode, the plurality of terminals 73 carried on a DUT are pressed against the ends 58*a*, 59*a*, etc. of the individual pairs of contact sliders 53*a*, 56*a*, etc. The resilience of block 63 provides force assuring that slider ends 58*a*, 59*a*, etc. make good electrical contact with terminals 73. The resilience of block 63 allows ends 58*a*, 59*a*, etc. to accommodate for deviations in coplanarity of terminals 73.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. A test system, comprising:
   a plurality of contact assemblies for a Kelvin contact system, each contact assembly including first and second similar conductive slider contacts, each slider contact having an elongate body of predetermined shape and a contact surface on an end thereof, first and second similar conductive laminations, each conductive lamination having a similar interior space and a slot extending from the exterior of the lamination to the interior space, said slot of the first lamination matching the predetermined of the first slider contact for accepting the first slider contact and allowing sliding of the first slider contact along the slot and into and out of the interior space, said slot of the second lamination for accepting the second slider contact and allowing sliding of the second slider contact along the slot and into and out of the interior space, and an insulating lamination having an internal space substantially matching the conductive laminations and an exterior shape similar to that of the conductive lamination's exterior shape, wherein the contact assembly includes the conductive laminations in side-by-side alignment with the insulating lamination interposed between the conductive laminations, and with the first and second slider contacts within the lamination's slots, wherein at least the first lamination's slot projects away from a bottom wall of the lamination defining a portion of the interior space, and wherein said wall includes a first contact foot projecting away from the interior space, and wherein the second lamination includes a bottom wall adjacent to the first lamination's bottom wall, said second lamination's bottom wall having a second contact foot projecting away from the interior space and staggered with respect to the first contact foot;
   an insulating circuit board having on a surface thereof a first plurality of contact pads in substantial alignment along a first line, and a second plurality of contact pads in substantial alignment along a second line, each contact pad of the second plurality in offset relation along the second line to a contact pad of the first plurality, wherein the offset relation between the first and second pluralities of contact pads and the spacing between the first and second pluralities of contact pads aligns an individual first contact pad with the contact assembly's first contact foot and an adjacent second contact pad with the contact assembly's second contact foot; and
   an insulating housing mounted on the circuit board, the housing having a plurality of side-by-side slots, each for accepting a single contact assembly, each of said slots aligned with a first contact pad and a second contact pad, said alignment of a slot allowing a first contact assembly first contact foot to contact a first contact pad, and allowing a second contact assembly second contact foot to contact a second contact pad.

2. The test system of claim 1, wherein a wall of the housing defines one side of each slot, wherein the walls have openings aligned with the contact assemblies laminations' interior spaces, and including an elastomeric block passing through each of the walls openings and the lamination's interior spaces, said elastomeric block contacting and applying resilient force to the interior end of the slider contacts.

3. The test system of claim 2, wherein each contact assembly lamination includes a nose projecting from the bottom wall, and wherein the housing includes a ledge facing toward the circuit board and the laminations' noses, and an elastomeric block interposed between the ledge and the noses, said elastomeric block forcing the contact feet onto the contact pads.

* * * * *